(12) United States Patent
Dekker et al.

(10) Patent No.: US 8,105,873 B2
(45) Date of Patent: Jan. 31, 2012

(54) FLEXIBLE SEMICONDUCTOR DEVICE AND IDENTIFICATION LABEL

(75) Inventors: Ronald Dekker, Eindhoven (NL); Theodorus Martinus Michielsen, Eindhoven (NL); Antoon Marie Henrie Tombeur, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/878,066

(22) Filed: Sep. 9, 2010

(65) Prior Publication Data

US 2010/0328028 A1 Dec. 30, 2010

Related U.S. Application Data

(63) Continuation of application No. 10/563,416, filed on Jan. 3, 2006, now Pat. No. 7,816,774.

(30) Foreign Application Priority Data

Jul. 4, 2003 (EP) .................................. 03102020

(51) Int. Cl.
*H01L 21/00* (2006.01)

(52) U.S. Cl. .................. 438/106; 257/679; 257/684

(58) Field of Classification Search .................. 438/106; 257/679, 684; 235/487, 492
See application file for complete search history.

(56) References Cited

U.S. PATENT DOCUMENTS

| 5,012,236 A | 4/1991 | Troyk et al. |
| 5,192,716 A | 3/1993 | Jacobs |
| 5,788,854 A | 8/1998 | Desaigoudar et al. |
| 6,291,877 B1 | 9/2001 | Usami et al. |
| 6,607,135 B1 | 8/2003 | Hirai |
| 7,059,534 B2 | 6/2006 | Takahashi |
| 2002/0048907 A1 | 4/2002 | Miyamoto et al. |

FOREIGN PATENT DOCUMENTS

| DE | 19601358 C2 | 7/1996 |
| WO | 9954842 | 10/1999 |
| WO | 2004042780 A3 | 5/2004 |
| WO | 2004105125 | 12/2004 |

*Primary Examiner* — Ori Nadav

(57) ABSTRACT

Provided is a flexible device (100) having an integrated circuit (5) and an antenna (6) which is incorporated or directly coupled to the interconnect structure of the integrated circuit (5). An electrically insulating or dielectric layer (4) is present as support layer for both antenna (6) and integrated circuit (5). Preferably the substrate (10) is removed at non-silicon areas (10B) outside the active areas (10A) of the integrated circuit (5). This removal can be combined with the use of a substrate of monocrystalline silicon. The flexible device is very suitable for integration in identification labels and security paper, and can be manufactured using a temporarily attached carrier substrate.

20 Claims, 3 Drawing Sheets

FLEXIBLE SEMICONDUCTOR DEVICE AND IDENTIFICATION LABEL

Figure 1A:
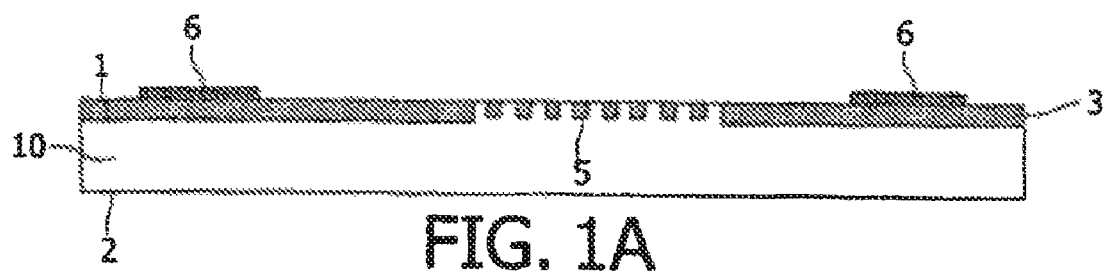

This is a continuation of prior application Ser. No. 10/563, 416 filed Jan. 3, 2006 and is incorporated by reference herein.

The invention relates to a flexible semiconductor device comprising a semiconductor substrate and an integrated circuit provided with a plurality of semiconductor elements, that are defined at a surface of the semiconductor substrate and interconnected according to a desired pattern in an interconnect structure.

The invention also relates to a security paper comprising the flexible semiconductor device and to an identification label comprising a carrier and the flexible semiconductor device.

The invention further relates to a method of communication between a reader and at least one flexible semiconductor device.

The invention further relates to a method of manufacturing a flexible semiconductor device comprising the steps of providing at least one semiconductor device comprising an integrated circuit provided with a substrate and with a plurality of semiconductor elements, that are interconnected according to a desired pattern in an interconnect structure, the device having a first and an opposite second side, on which first side the interconnect structure is present and on which second side the substrate is present, and thinning the substrate from the second side of the device, so as to make the device flexible.

Such a flexible device, such a label and such a method of manufacturing are known from U.S. Pat. No. 6,291,877. The known device is an integrated circuit defined in a so-called silicon-on-insulator (SOI) substrate. The SOI substrate is thinned after definition of the integrated circuit so that only the insulator layer and the silicon layer on top thereof are maintained. Consequently, the device becomes very thin, for instance 5 to 10 micrometers and is rendered flexible. It is subsequently bonded in such a configuration that it is held between card substrates by a flexible adhesive. The integrated circuit is provided therein using bond pads, that are connected to wiring on the card substrate by conductive ink. This conductive ink is printed on one of the card substrates after assembly of the integrated circuit thereon. The wiring comprises for instance a coil used for the receipt and transmission of data and energy.

It is a disadvantage of the known device that the resulting identification label is limited to use at lower frequencies. The conductive ink forms a track of considerable impedance, which is particularly disadvantageous at higher frequencies. The track cannot be shortened easily in view of the limited resolution of the printing obtained using the conductive ink. The printing of a metal by means of a sol-gel method is in principle an alternative; however, the conversion temperature of such a sol-gel precursor to a metal limits the choice of card substrates.

It is thus a first object of the invention to provide a flexible device of the kind mentioned in the opening paragraph in which the wiring and connection technology does not limit the frequency for receipt and transmission of data and energy.

It is a second object of the invention to provide an identification label comprising such a flexible device.

The first object is achieved in that the semiconductor substrate laterally extends in an active area; and that a support layer of electrically insulating material and an antenna are present. The antenna is defined laterally outside the active area in an electrically conductive layer adjacent to the support layer and is electrically connected to the interconnect structure, the semiconductor substrate being absent in a non-substrate area between the antenna and the integrated circuit.

The second object is achieved in the label by implementing this flexible device. The provision of an integrated antenna takes away the necessity of a connection to a card substrate. Hence, no conductive ink at all is needed.

It is an advantage of the identification label of the present invention, that the assembly costs are reduced substantially. The known label was manufactured using at least two process steps which needed specific assembly methods: first the provision of the integrated circuit to a specific location on the card substrate; and second the provision of the conductive track by printing. No such specific location and no specific bonding is needed for the assembly of the present label.

It is a further advantage that the label may comprise only a single card substrate, instead of two. The flexible device can be attached thereto or integrated therein in a lamination process. This increases the flexibility of the label and reduces the components and thus the costs.

It is another advantage that the integrated circuit comprises all functionalities. If it is meant for use in a consumer apparatus, on a polymer package of an article, then the manufacturer of such an apparatus or package does not need to have any knowledge of printing or antennas.

Moreover, the integrated antenna is generally limited in size. In comparison with the wirings on the card substrate and the conductive ink track, the visibility of the flexible device with integrated antenna is thus diminished. This is clearly an advantage for many security applications, in which it is undesired that everybody recognizes the security feature immediately. Beyond that, the reliability of the label is improved in view of the absence of any connection.

Due to the support layer of electrically insulating material the resonating behavior of the antenna is improved. Furthermore, the support layer allows to remove any additional support substrate, before the devices are separated. In the known device, a support substrate is used and it is removed only after the flexible device is attached to the card substrate.

The support layer also allows that the semiconductor substrate is completely absent between the active area and the antenna. In this manner, the interaction between antenna and integrated circuit is reduced considerably, leading to good antenna performance. Preferably, the semiconductor substrate is absent anywhere outside the active area. This improves the flexibility. The active area of the substrate is preferably in the shape of a mesa, which shape is robust and can be made with conventional etching techniques.

From DE 196 01 358 C2 a similar device is known. However, in this device, the antenna is provided at the surface of the integrated circuit. The substrate is not removed in certain areas, and no support layer is provided. The device of the invention has at least two advantages: the antenna of the invention can have a larger size, leading to lower transmission frequencies and increased distance and power transmission; and the mutual interaction between antenna and integrated circuit is diminished substantially.

The support layer comprises for instance a polymer material, such as polyamide, polycarbonate, fluorinated polymers, polysulfonates, epoxides, polyesters and the like. The use of polyamide is preferred. In order to improve the antenna behavior, magnetic particles can be present in the support layer. Suitable magnetic particles are ferrite particles, with an average diameter of preferably 0.5-1.0 micrometer. A further advantage of such support layer is that it can act as a protection against moisture, dust and contaminations. In the prior art, such continuous support layer cannot be realized since contacts need to be applied from the device to the antenna.

The integrated circuit of the device of the invention can be provided in different technologies. First of all, it can be defined at the surface of a silicon-on-insulator substrate. This technology is well known. Secondly, use can be made of semiconductor substrates of III-V material or on the other hand of polycrystalline silicon. Such a choice depends on the desired performance of the integrated circuit. Preferably, use is made of a conventional semiconductor substrate of monocrystalline silicon. This has the advantage that it is cheap as compared to a SOI substrate, while at the same time the designs conventionally used for non-flexible integrated circuits can be applied. Furthermore, the use of monocrystalline silicon allows the use of standard semiconductor factories. The mesa structure enables a good flexibility of the device.

The flexible device of the invention can be manufactured advantageously with a substrate transfer method, using a temporary support.

Different antennas can be implemented, such as antennas based on capacitive coupling, dipole antennas, multipole antennas. It is however preferred that the antenna is an inductor suitable for wireless communication. The available frequency range is roughly from 1 to 3 GHz. The minimum is determined by the coil size, the maximum is determined by the strength of the rectifiers in the integrated circuit. An inductor having a turn with a surface area of 1.5*1.5 mm is suitable for a frequency of 2.4 GHz. Such an antenna can be used for transmission over a distance of 3 mm so as to provide 3-4 mW at 2V, 100 mA.

The antenna quality can be improved further if a further inductor winding is provided at a second side opposite to the first side. The second side is available for a further winding as the substrate is removed. The contacts between the windings can be made through the interconnect structure. The further winding may or may not to have the same diameter and shape as the first winding. However, alternatively, the windings, or generally, the antenna structures at both sides can be complementary. Also the inductor at the second side could be spiralic. Furthermore, more than one antenna may be implemented for different purposes: one relatively large antenna for the transmission of energy to the semiconductor device, and one relatively small antenna for the transmission of signals.

In a suitable further embodiment, the integrated circuit is laterally located within the inductor. An optimal use of available surface area is thus realized. Furthermore, particularly if the integrated circuit is positioned centro-symmetrically with respect to the inductor, the influence of the inductor on the circuit is limited.

It is particularly preferred that the integrated circuit is subdivided into a plurality of circuit blocks, which are mutually spaced apart, but interconnected through the interconnect structure. This reduces the magnitude of eddy currents in the integrated circuit as a result of the inductor. It is further preferred herein that the semiconductor elements are defined at a surface of a semiconductor substrate; and the device comprises active areas corresponding to the circuit blocks, and a non-substrate area is defined laterally between the active areas and around these areas, the semiconductor substrate being absent in said non-substrate area.

In another embodiment a perpendicular projection of the integrated circuit onto the electrically conductive layer of the antenna at least substantially overlaps with the antenna. This embodiment is particularly suitable in combination with advanced type semiconductor elements which thus have sub-micronscale resolution. The advantage of this embodiment is first of all the very small eddy current. In addition thereto, the antenna can form a mechanical protection for the integrated circuit.

In a further embodiment the integrated circuit is provided with a security coating, which is a layer that in principle is not transparent to either ultraviolet radiation, visible light or infrared radiation. Besides, such a coating is difficult to remove by means of etching. In this manner it offers a good protection against hackers that desire to get access to or to modify the circuit design. Such security coating is preferably a layer filled with particles. The layer may be an organic material or an inorganic material. Thickness and material of the coating will be an optimum between perfect protection and flexibility. The application of a security coating is easier in the device of the invention than in the prior art, as no bond pads are necessary, and hence it is possible to apply an unpatterned coating.

Security paper with an integrated circuit is for instance known from WO-A 99/54842. Herein the integrated circuit comprises an organic semiconductor material. This has the disadvantage of being new, untested technology. For such security applications, well known and corroborated technology appears preferable. The security paper of the invention is characterized in that the flexible device of the invention is present. This has the important advantage that a laminating technology can be used for integration of the flexible device. As a result, the device can be fully embedded in the paper. It is thus less easy to remove the flexible device from the security paper. Moreover, the integrated circuit is hidden to a certain extent. The device can further be provided with a security coating for optimal protection.

Within the context of this application the term 'paper' is understood to mean paper which is made from natural or synthetic fibers, as well as "paper" which can nowadays be produced from plastic films, which paper is known for use as security paper. The paper can be used for a variety of applications, including banknotes, passports and other official documents, tickets and the like.

Other security features may be present in addition to the integrated circuit. Examples thereof are a conductive security thread, holograms, optically active elements, as well as the presence of detectable fluorescent, magnetic or conductive particles or fibers in the substrate.

The security paper and/or the flexible device are very suitable for integration in identification documents or in apparatus, and particularly in the encapsulation thereof. Its flexibility and its thinness renders it very suitable for integration in security paper and the like, and thus for applications in which visibility of the flexible device is not preferred.

The invention also relates to the use of the flexible device of the invention in a wireless communication. In such wireless communication both energy and data are sent from a reader to the flexible device. After that a desired operation has been fulfilled, the data are returned to the reader. The desired operation generally involves the reading of a memory according to a predetermined pattern. Cryptographic techniques can be used to improve the secrecy of the wireless transmission. One very suitable manner known in cryptography is the use of hash-functions. In this case, the flexible device randomizes the first signal before reading the memory. This randomizing occurs with a non-invertible function. After the reading, a second hash-function may be applied. The resulting second signal is then compared with a reference signal stored in the reader or in a central database that is connected to the reader. This reference signal has been obtained using the same hash functions. As there is a very large number of possible first signals, any readout can use another first signal, thereby decreasing the chance that the memory code is obtained by unauthorized persons. In a further embodiment, the flexible device is provided with a security coating having a measurable property inhomogeneously distributed over the coating, and with measurement elements to measure the said property. The property is preferably realized with embedded dielectric, conductive, resistive or magnetic particles of different constitution, size and density. The measurement elements therein measure the impedance. This provides a very good protection, and is particularly suitable for use in combination with a hash function, as described in the non-prepublished application EP03101515.9 (PHNL030634).

In a preferred embodiment the data transmission is carried out such, that for signals from the semiconductor device are sent back to a reader at another frequency than the frequency used to transmit from the reader to the semiconductor device. Nevertheless, it is possible in many cases to provide only one antenna, while there are two separate frequencies for receiving and transmitting of signals, and hence both signals can be separated easily and cheaply.

The signal to be sent back uses for instance a lower frequency, which is realized through the provision of a divider. Alternatively, this frequency can be a harmonic frequency and preferably the third harmonic. The signal can then be measured by the reader by comparison of the magnitudes of the signal at the harmonic frequency or frequencies. The embodiment has several advantages: first of all, the sending back is more efficient due to the higher frequency on the same antenna. Additionally, the detection of the signal sent back is more difficult for an unauthorized person. This is as antennas for higher frequencies are less conventional. Particularly suitable hereto is the inclusion of a non-linear element in the semiconductor device. Such non-linear element is preferably placed in series with the antenna. This will result in peaks at frequencies around the harmonic frequency. As the harmonic frequency is exactly known, such peaks can be detected easily.

In a further embodiment, a modulator is added in the semiconductor device. This allows that the signal from the reader to the device contains a code. Due to the non-linear element, the bits will be transformed into a series of short signals (in a somewhat broadened time period), that are easily detectable. The use of the modulator has the additional advantage that the problem of anti-collision can be solved. This problem is particularly relevant for banknotes, as one should be able to read out a pile of these at once. There appear to be two particular solutions for this problem. The first solution is that after the identification of a first semiconductor device, a specific code is sent to that device so that it does not send out any further response for a certain period. A second option is that after the identification of the first device, the signal transmitted to the banknotes will request a modified modulation. The receiver will then either receive signals at another frequency, or the number of banknotes responding at the required response frequency diminishes, as one responds at another frequency.

Both the use of modulation and the use of the harmonic have the advantage that the semiconductor device can be manufactured in a simpler technology. The reason therefor is that no divider is needed. Particularly use could be made of polycrystalline silicon instead of monocrystalline silicon, and also the channel length is less critical. As a summary, the embodiment is very suitable for semiconductor devices that are included in banknotes and other security paper, which require low cost and a small distance of transmittal.

Figure 2:
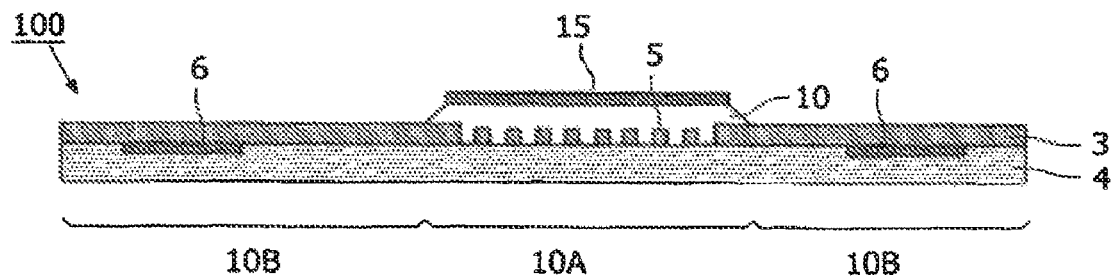
Figure 6:
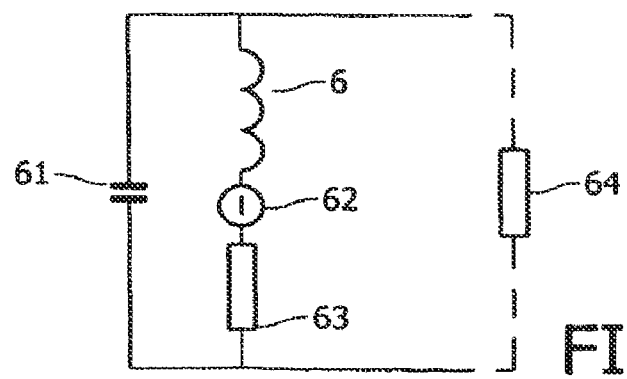
Figure 3:
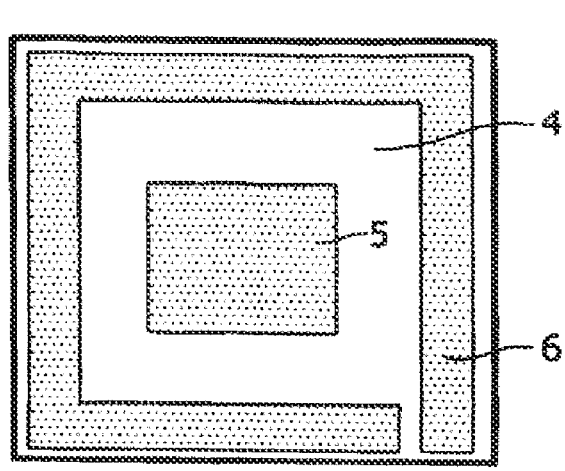
Figure 4:
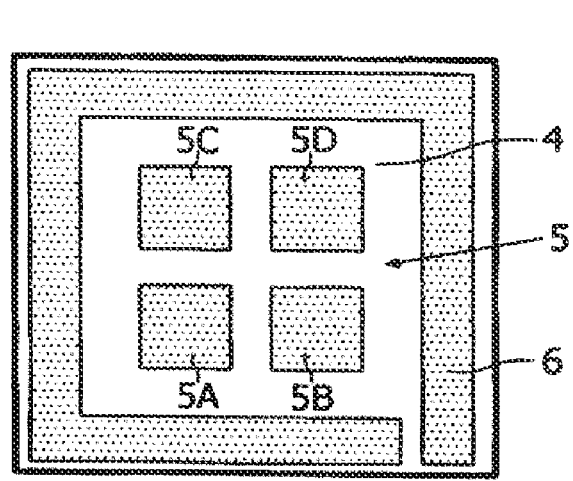
Figure 5:
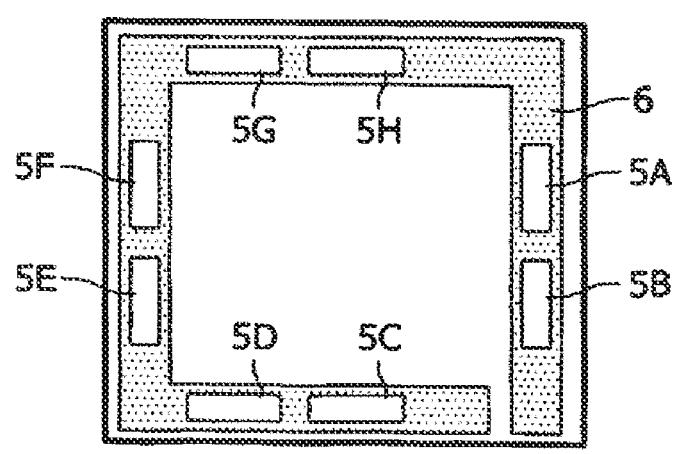

These and other aspects of the invention will be further elucidated with reference to the Figs., in which:

FIGS. 1A-G show diagrammatic cross-sectional views of different stages in the manufacture of the flexible device of the invention;

FIG. 2 shows the resulting flexible device of the invention;
FIG. 3 shows a first layout of the antenna and the integrated circuit in the flexible device of the invention;
FIG. 4 shows a second layout;
FIG. 5 shows a third layout; and
FIG. 6 shows an electrical diagram of the circuit with the antenna.

The Figs. are not drawn to scale, and like reference numbers refer to like parts.

FIG. 1A shows a substrate 10 with a first side 1 and a second side 2. The substrate 10 comprises monocrystalline silicon. On top of the substrate a thermal oxide is present, on which an interconnect structure 3 is provided. The interconnect structure generally comprises 3 to 5 conducting layers that are mutually separated by patterned dielectric layers. The interconnect structure 3 interconnects the semiconductor elements defined at the first side of the substrate 10. The semiconductor elements are in this case CMOS transistors and, in addition, diodes for use as rectifiers. Together, the interconnect structure 3 and the semiconductor elements define the integrated circuit 5. In addition to the integrated circuit an antenna 6 is present. In this embodiment, the antenna 6 is an inductor having one turn.

Although it is suggested in the FIG. 1, that the antenna 6 is present on top of the interconnect structure 3, it is preferred in view of process steps that the antenna 6 is deposited as part of one metal layer of the interconnect structure 3. Although it is shown in the FIG. 1, that the interconnect structure 3 extends over the complete substrate 10, this need not be the case. In fact, it is preferred for reasons of limiting mechanical stress, that both the metal layers and the dielectric layers of the interconnect structure are deposited only in that region in which they contribute to the functionality.

Further elements such as diodes, Schottky diodes, bipolar transistors, capacitors, resistors, opto-electrical elements and others may be present as well. They are interconnected according to a desired circuit pattern, that is known per se to the skilled person. To manufacture the switching elements and other elements, processes are carried out at or in the vicinity of the substrate 10. These processes include for instance oxidation steps, photolithography steps, selective etching steps and intermediate doping steps such as diffusion or ion implantation, all known per se. In the case of thin film or CMOS transistors, source and drain electrodes as well as an intermediate channel are provided in the active layer, that is covered by a gate oxide layer and a gate electrode of polycrystalline silicon, a metal, a silicide. Additional metal layers for interconnection purposes can be provided. However, it is preferred to keep the number of layers limited.

Figure 1B:
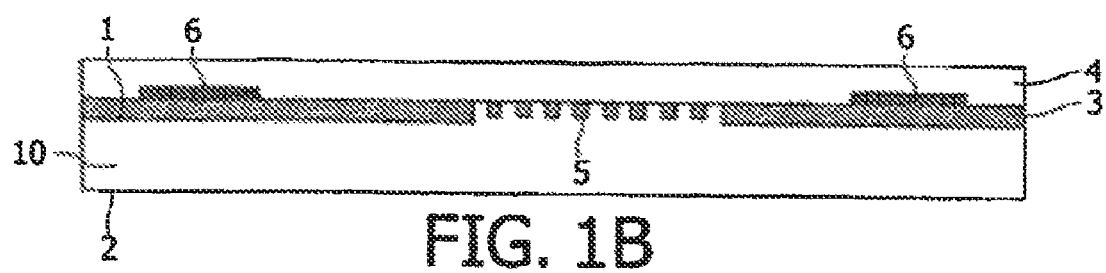

FIG. 1B shows the substrate 10, after a coating 4 is provided. The substrate and the interconnect structure are covered with a flexible coating, preferably a polymer. Preferably, the layer is provided by spin coating, spraying or the formation of a film, and is subsequently cured. The adhesion of the coating 4 to the substrate 10 and the stack of layers on top of that is enhanced in that first a cleaning step with fuming $HNO_3$ is carried out and after which it is treated with a suitable primer. Then a polyamide resin coating 4 is formed in that a precursor of the polyimide is applied. After spincoating a solution of this material onto the wafer, the solvent is evaporated at 125° C. Thereafter, a heating step at 200° C. is carried out to activate the primer. Then a photoresist such as HPR504 is applied and exposed.

Figure 1C:
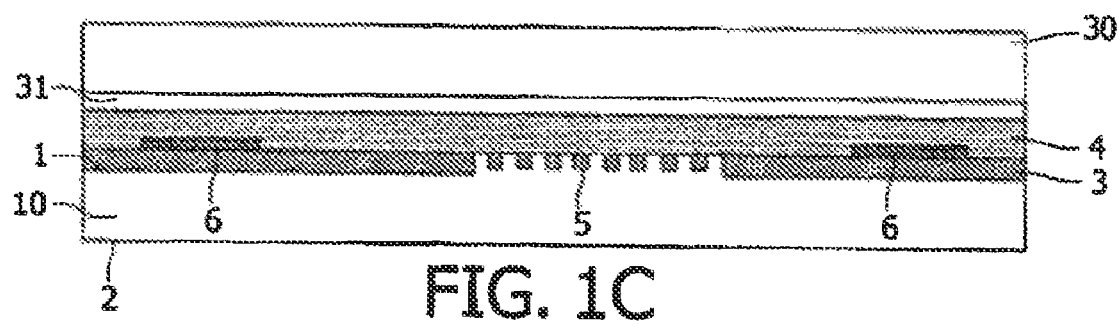

FIG. 1C shows the result after some further steps. First, the coating is patterned. To pattern the coating us is made of conventional developer solutions such as cyclopentanone. Then, the resist is stripped in a mixture of aceton and isopropanol. Hereafter, the coating 4 is cured at 300-400° C. Finally, a 0.5 μm thick layer of PECVD oxide is deposited at about 300° C. This layer is not shown explicitly.

Thereafter, the protection areas which are defined laterally outside the area of the flexible device, are treated with adhesion means, in this case a silane coupling agent. This treatment is done in a so-called "edge beat removal" fashion. Alternatively, the protection areas are dipped into a solution of this silane primer. Next, a UV glue releasable glue layer 31 and a carrier substrate 30 are provided. In this manner, the substrate 10 is temporarily attached to the carrier substrate 30 with a UV releasable glue layer 31. The carrier substrate 30 is transparent, so that the glue layer can be released with UV-irradiation.

Figure 1D:
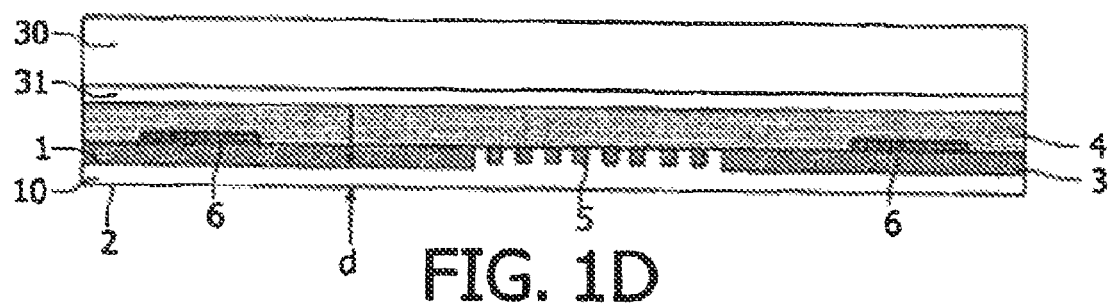
Figure 1E:
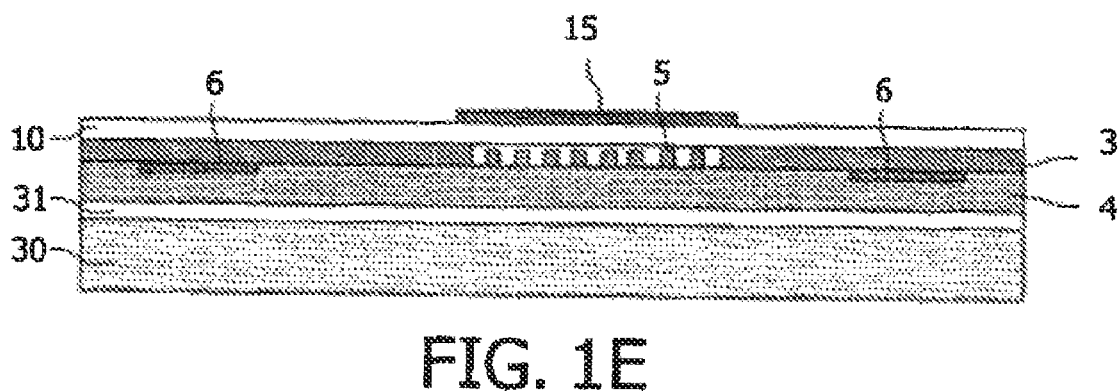

FIG. 1D shows the result after the substrate 10 has been thinned to a thickness d of about 5-20 micrometers. The substrate is thinned for instance by grinding, but alternatively or in addition thereto etching with for instance a KOH solution can be used. FIG. 1E shows the result after a suitable hard-etch mask 15 is provided and patterned so as to protect the integrated circuit 5. The hard-etch mask can be chosen as desired, as is known to those skilled in the art.

Figure 1F:
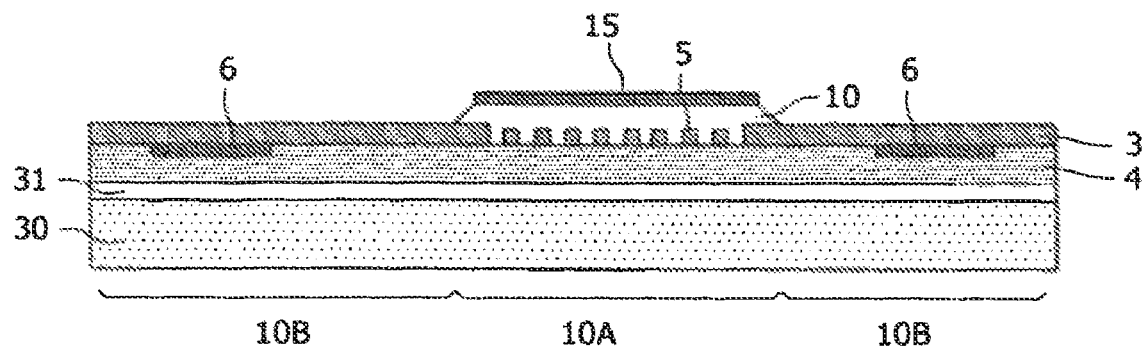

FIG. 1F shows the result after the substrate 10 is removed in areas which are not protected by the hard etch mask 15. In this manner active areas 10A and non-substrate areas 10B are created.

Figure 1G:
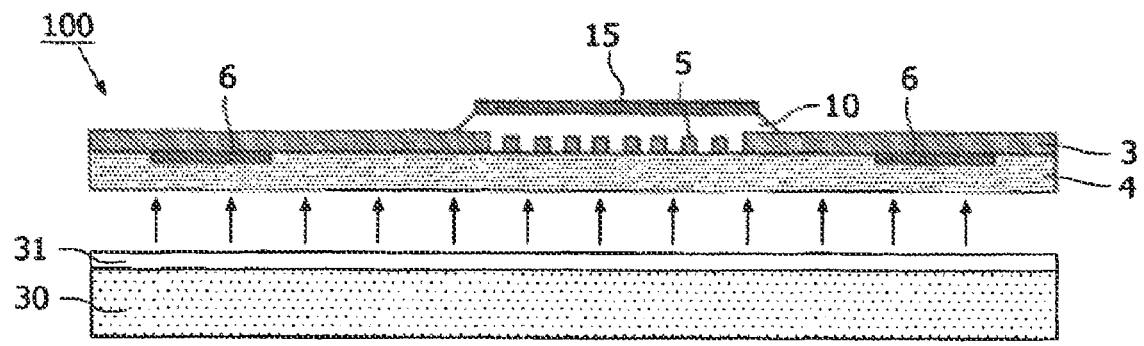

FIGS. 1G and 2 finally show the device 100 after removal of the carrier substrate 30. First use is made of UV-irradiation. Thereafter the substrate is separated into individual devices 100. This is done by cutting through the oxidic layer, which is present laterally around the devices 100. The cutting operation is performed with for instance a razor blade. Although the flexible device 100 is shown here as one device, it will be understood that this includes a plurality of devices 100. These may be separated afterwards. Also the separation step may be done by the customer. This method is further elucidated in the non-prepublished application EP02079697.5 (PHNL021153) which is included herein by reference.

FIG. 3 shows a first layout of the device 100 of the invention. Herein the antenna 6 is an inductor and the integrated circuit 5 is provided in the area bounded by inductor 6. The antenna 6 and the integrated circuit are present on the layer of electrically insulating material 4 acting as a support. More specifically, the integrated circuit 5 is positioned centro-symmetrically, so as to limit the negative influence of the inductor 6 on said integrated circuit. An interconnect from the inductor 6 to the integrated circuit 5 is not shown, but is present.

FIG. 4 shows a second layout. Herein, the integrated circuit 5 is partitioned into several areas 5A-5D. This is assumed to reduce the eddy currents in the integrated circuit 5. The areas 5A-5D are mutually interconnected, although this is not shown. The integrated circuit 5 comprises a rectifier, a memory, a state machine, such as a shift register or a microcontroller, a clock generator, and some further interconnects and transistors for switching and/or other amplifying purposes. The partioning is preferably realized by putting each of the functions in a separate area.

FIG. 5 shows a third layout. Herein, the integrated circuit 5 is partioned into several areas 5A-5H. The areas 5A-5H are positioned such that there is a substantial overlap with the antenna 6. This will further decrease any eddy currents and other impact of the antenna on the integrated circuit 5. The number of areas is subject to further design. This furthermore allows to provide a second turn of the antenna 6 inside the first turn, or if necessary to use another antenna design than the inductor, for instance a dipole, without using a substantially larger area.

FIG. 6 shows an electrical diagram of the antenna 6 with some additional components. Shown herein is the inductor acting as the antenna 6, a capacitor 61 for tuning purposes, as well as a voltage inducer 62, a sum resistance 63 and a load resistor 64. The load resistor 64 can be a rectifier circuit, which converts the RF voltage to a DC voltage and may include the active circuitry of the integrated circuit. The sum resistance 63 is the sum of the series radiation resistance $R_{rad}$ and the resistive losses $R_{ohmic}$. This radiation resistance $R_{rad}$ is small for an inductor with a number of turns, e.g. it is approximately equal to $3.1 \times 10^4$ $(nS/\lambda^2)^2$, wherein S is the area of the antenna, $\lambda$ is the wavelength and n is the number of turns. As a consequence, the radiation resistance $R_{rad}$ of a 1- or 2-turn inductor at a chip is less than $0.1\Omega$ at a frequency of 2.4 GHz. By integration of the high-Q parallel LC-circuit, the relatively low voltage, induced in the radiation resistance $R_{rad}$ is multiplied by the Q-factor of the LC tank. The Q-factor is about 60 at 2.4 GHz. As a result, the inductor is present outside the active area, at a support substrate of electrically insulating material. This Q is sufficiently high to achieve voltage levels of several volts and power levels of several mW in the integrated circuit, on transmission over a short range, e.g. 1-2 mm. The external RF source power is about 0.5 W at 2.4 GHz. Optimum power efficiency will be achieved when the load on the tank equals the impedance of the tank, e.g. approximately equal to $Q^2$. the sum resistance.

In short, provided is a flexible device 100 having an integrated circuit and an antenna which is incorporated in or directly coupled to the interconnect structure of the integrated circuit. An electrically insulating or dielectric layer is present as a support layer for both antenna and integrated circuit. Preferably the substrate is removed at non-substrate areas outside the active areas of the integrated circuit. This removal can be combined with the use of a substrate of monocrystalline silicon.

The invention claimed is:

1. A method of manufacturing a flexible semiconductor device comprising:

providing a semiconductor substrate, with a surface having an active area which extends in a lateral direction;

providing an integrated circuit having a plurality of semiconductor elements at the active area of the surface of the semiconductor substrate, the semiconductor substrate having a suitable thickness so as to be flexible, and which semiconductor elements are interconnected according to a desired pattern in an interconnect structure, providing a support layer of electrically insulating material, and providing an antenna, which is located laterally outside the active area in an electrically conductive layer adjacent to the support layer and is electrically connected to the interconnect structure, the antenna and the integrated circuit being supported by the support layer, and the semiconductor substrate extending in the area of the semiconductor elements and extending in an area which is located not directly above the semiconductor elements, and the semiconductor substrate being absent in a non-substrate area extending over the antenna and extending in a gap between the antenna and the integrated circuit, and wherein at least one conductor from the interconnect structure extends laterally to the antenna so as to constitute the electrical interconnection.

2. The method of claim 1, wherein the integrated circuit is devoid of any bond pad structures.

3. The method of claim 1, wherein:
the integrated circuit is provided with a passivation, the interconnect structure being sandwiched between the passivation and the semiconductor substrate, and
the support layer is part of the passivation of the integrated circuit.

4. The method of claim 1, wherein the active area of the substrate is in the shape of a mesa.

5. The method of claim 1, wherein the semiconductor substrate is present only in the active area.

6. The method of claim 1, wherein the antenna is an inductor suitable for wireless communication.

7. The method of claim 6, wherein the integrated circuit is substantially surrounded by the inductor.

8. The method of claim 7, wherein the integrated circuit is subdivided into a plurality of circuit blocks, which are mutually spaced apart, but interconnected through the interconnect structure.

9. The method of claim 8, wherein the device comprises active areas corresponding to respective circuit blocks, and a non-substrate area extends laterally between the active areas and around these active areas, the semiconductor substrate being absent in said non-substrate area.

10. The method of claim 6, wherein a perpendicular projection of the integrated circuit onto the antenna at least substantially overlaps with the antenna.

11. The method of claim 1 wherein the flexible semiconductor device is utilized as a security paper.

12. The method of claim 1 wherein the flexible semiconductor device is utilized as an identification label.

13. The method of claim 12, further comprising providing conducting elements in order to improve wireless energy transmission.

14. The method of claim 12, in which the carrier comprises security paper, which paper encapsulates the flexible device.

15. The method of claim 14, wherein the identification label is utilized as a banknote or security paper.

16. The method of claim 11 wherein the security paper is utilized as an identification document.

17. A product produced by the method of claim 1, comprising a flexible semiconductor device.

18. A method of communication between a reader and at least one flexible semiconductor device produced by the method of claim 1, comprising the steps of
providing a first signal from the reader to the antenna of the flexible device;
reading at least part of the memory of the flexible device using energy and information in the first signal, thereby supplying a second signal, and
transmitting the second signal from the flexible device to the reader.

19. A method as claimed in claim 18, wherein the second signal is compared by the reader to check the identity or verify the authenticity of the label, document or apparatus of which the flexible device is part.

20. A method of manufacturing a flexible semiconductor device comprising the steps of:
providing a body with at least one integrated circuit having a plurality of semiconductor elements at a surface of the semiconductor substrate, and which elements are interconnected according to a desired pattern in an interconnect structure, which interconnect structure is provided with a passivation;
attaching a temporary carrier to the passivation of the body;
removing the semiconductor substrate at least partially, and
removing the temporary carrier so as to obtain the flexible semiconductor device,
wherein
the interconnect structure extends with a first conductor to an antenna that is laterally displaced from the integrated circuit, which antenna is covered by the passivation; and
the semiconductor substrate extends in the area of the semiconductor elements and extends in an area which is located not directly above the semiconductor elements and is removed completely in a non-substrate area over the antenna and in a gap between the antenna and the semiconductor elements.

* * * * *